United States Patent
Oyu et al.

(10) Patent No.: US 7,151,033 B2
(45) Date of Patent: Dec. 19, 2006

(54) METHOD FOR MANUFACTURING A SEMICONDUCTOR DEVICE HAVING A LOW JUNCTION LEAKAGE CURRENT

(75) Inventors: Kiyonori Oyu, Tokyo (JP); Kensuke Okonogi, Tokyo (JP); Koji Hamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 49 days.

(21) Appl. No.: 11/029,343

(22) Filed: Jan. 6, 2005

(65) Prior Publication Data
US 2005/0153526 A1 Jul. 14, 2005

(30) Foreign Application Priority Data
Jan. 9, 2004 (JP) .............................. 2004-003632

(51) Int. Cl.
*H01L 21/336* (2006.01)
*H01L 21/322* (2006.01)
(52) U.S. Cl. .................. 438/290; 438/308; 438/475
(58) Field of Classification Search ................ 438/162, 438/290, 308, 475
See application file for complete search history.

(56) References Cited
U.S. PATENT DOCUMENTS
6,590,230 B1 * 7/2003 Yamazaki et al. ............ 257/72

2005/0134754 A1 * 6/2005 Yang et al. .................... 349/43

FOREIGN PATENT DOCUMENTS
JP H06-061486 A 3/1994
JP 3212150 B2 7/2001

OTHER PUBLICATIONS

"Defects related to DRAM leakage current studied by electrically detected magnetic resonance", T. Umeda[a*], Y. Mochizuki[a], K. Okonogi[b],K. Hamada[b], vol. 308-310, pp. 1169-1172(2001).

* cited by examiner

Primary Examiner—Hsien-Ming Lee
(74) Attorney, Agent, or Firm—Sughrue Mion, PLLC

(57) ABSTRACT

A method for manufacturing a DRAM device includes a hydrogenating step conducted to source/drain diffused regions in a hydrogen ambient at a substrate temperature not lower than 350 degrees C., and a dehydrogenating step in an inactive gas ambient at a substrate temperature of lower than 350 degrees C., before a packaging step. If a defective cell having a lower refreshing time is found in the test before the packaging step, the defective cell is replaced by a redundant cell. The resultant DRAM has a lower degradation in the refreshing characteristic after the packaging step.

9 Claims, 4 Drawing Sheets

METHOD FOR MANUFACTURING A SEMICONDUCTOR DEVICE HAVING A LOW JUNCTION LEAKAGE CURRENT

BACKGROUND OF THE INVENTION (a) Field of the Invention

The present invention relates to a method for manufacturing a semiconductor device having a low junction leakage current and, more particularly, to a method suited to manufacturing memory devices such as DRAM and SRAM.

(b) Description of the Related Art

Portable data processing devices such as cellular phone and personal data assistant are increasingly used in these days. In general, a memory cell in a memory device such as DRAM and SRAM used in the portable data processing devices should have a MOS transistor or MOS transistors having lower junction leakage current. With reference to FIGS. 1A to 1G, a conventional method for manufacturing a DRAM device will be described hereinafter.

A 250-nm-deep trench is formed on a surface region of a silicon substrate 1, followed by depositing a silicon oxide film 2 within the trench to form a shallow trench isolation (STI) structure. Subsequently, a 10-nm-thick silicon oxide film 3 is formed on the silicon substrate 1, as shown in FIG. 1A, followed by implantation of boron ions through the silicon oxide film 3 for three times. The three-time implantation of boron ions is conducted at an acceleration energy of 250 keV and a dosage of $1 \times 10^{13}/cm^2$, at an acceleration energy of 150 keV and a dosage of $5 \times 10^{12}$ cm/$^2$, and at an acceleration energy of 80 keV and a dosage of $3 \times 10^{12}/cm^2$. Thereafter, a heat treatment is performed at a substrate temperature of 1000 degrees C. for 30 minutes to restore the silicon substrate from the damages caused by boron implantation, thereby forming p-wells 4 on the silicon substrate 1.

Subsequently, further implantation of boron ions through the thin silicon oxide film 3 is performed at an acceleration energy of 15 keV and a dosage of $1 \times 10^{13}/cm^2$, thereby forming p-type channel regions 6, as shown in FIG. 1B. After removing the thin silicon oxide film 3, a 6-nm-thick gate insulation film 7 made of silicon oxide is formed using a thermal oxidation technique. The threshold voltage of a cell transistor is generally designed by determining the impurity concentration profile of the p-type channel region 6 and the thickness of the gate insulation film.

Thereafter, on the gate insulation film 7 are consecutively formed a 100-nm-thick polysilicon film 9a doped with phosphorous at a concentration of $4 \times 10^{20}/cm^3$, a 70-nm-thick tungsten silicide film 9b, and a 130-nm-thick insulation film 8 including a silicon nitride layer and a silicon oxide layer. Subsequently, the insulation film 8, tungsten silicide film 9b and polysilicon film 9a are patterned to configure 2-layer gate electrodes 9 and overlying insulation films 8. Side-wall oxide films 10 are then formed on the side walls of the gate electrodes 9 by using a thermal oxidation technique. This thermal oxidation also oxidizes surface portions of the silicon substrate 1 exposed by the patterning process.

Thereafter, implantation of phosphorous ions is performed twice through the gate insulation film 7 by a self-aligned process using the gate electrodes 9 as a mask at an acceleration energy of 20 keV and a dosage of $7 \times 10^{12}/cm^2$, and at an acceleration energy of 15 keV and a dosage of $7 \times 10^{12}/cm^2$. Another heat treatment is then performed at a substrate temperature of 1000 degrees C. for 10 seconds to activate the implanted phosphorous ions for obtaining source/drain diffused regions 11 as well as to activate dopants in the diffused regions formed in the peripheral area of the memory device.

A silicon nitride film is then deposited and subjected to an etch-back process, thereby forming a 40-nm-thick silicon-nitride side spacers 12, as shown in FIG. 1E. Implantation of phosphorous ions through the gate insulation film 7 and the source/drain diffused regions 11 is then performed by a self-aligned technique using the insulation films 8 and the side spacers 12 on the gate electrodes 9, thereby forming electric-field alleviating regions 13 on the bottoms of the source/drain diffused regions 11.

Subsequently, as shown in FIG. 1F, a silicon oxide film and a silicon nitride film are consecutively deposited on the entire surface, thereby forming a 350-nm-thick interlayer dielectric film 14. The interlayer dielectric film 14 is then etched-back using an anisotropic etching technique for planarization thereof. A patterning process is then performed to the interlayer dielectric film 14, insulation films 8, side spacers 12 and gate insulation film 7 to form through-holes 15a for exposing therethrough surface portions of the source/drain diffused regions 11. Implantation of phosphorous ions is again performed by a self-aligned technique using the interlayer dielectric film 14, insulation films 8 and side spacers 12 as a mask, toward the bottom of the electric-field alleviating regions 13 through the source/drain diffused regions 11. A polysilicon film doped with phosphorous ions at a concentration of $2 \times 10^{20}/cm^3$ is then deposited on the interlayer dielectric film 14 and in the through-holes 15a, and etched-back to configure 350-nm-long contact plugs 15.

Subsequently, a 50-nm-thick interlayer dielectric film 19 made of silicon oxide is deposited and patterned to form through-holes 17a therein. A 100-nm-thick tungsten film is then deposited on the interlayer dielectric film 19 and in the through-holes 17a, and patterned to configure bit lines 17. Thereafter, an interlayer dielectric film 20 is deposited, followed by patterning the interlayer dielectric films 19 and 20 to form through-holes 21a therein and filling the through-holes 21a with contact plugs 21. Cell capacitors 18 each having a cylindrical structure and including a bottom electrode 22, an insulation film 23 and a top electrode 24 are then formed, the bottom electrode 22 being in contact with the underlying contact plug 21, as shown in FIG. 1G.

A hydrogenating step is then performed by disposing the resultant substrate in a hydrogen ambient while maintaining the substrate temperature at a temperature of 400 degrees C. for about an hour. The substrate temperature is then gradually lowered in the same hydrogen ambient, which is replaced by a nitrogen gas ambient after the substrate temperature is lowered below 250 degrees C.

The memory cells should be downsized along with the development of the higher-density DRAMs. For meeting this downsizing of the memory cell, the gate length of the MOS transistor must be reduced while maintaining the previous threshold voltage of the MOS transistor. This is generally achieved by increasing the dopant concentration of the channel region 6 of the MOS transistor. In this structure, however, there arises a problem that the electric field across the junction between the channel region 6 and the source/drain diffused regions 11 is intensified to thereby increase the junction leakage current. The increase of the junction leakage current degrades the charge storage capability, or data storage capability, of the memory cell. For reducing the junction leakage current, two technologies are considered: one for alleviating the electric field intensity across the p-n junction; and the other for reducing the number of vacancy type defects which are the origin of the junction leakage current.

The technology for alleviating the electric field intensity is generally employed in the conventional technique for preventing the decrease of charge storage capability of the memory cell, and a variety of proposals therefor have been presented. Patent Publication JP-3212150, for example, discloses a technique wherein the profile of the dopant concentrations (or carrier density) in the p- and n-type regions adjacent to the p-n junction are controlled so that the electric field across the p-n junction does not exceed 1 MV/cm, at which the local Zener effect markedly arises in general. However, the technology for alleviating the electric field across the junction, such as proposed in the publication, only achieves a limited effect for the far-downsized memory devices. Thus, the other technology for reducing the number of vacancy type defects now attracts more attentions in the memory device industry.

The vacancy type defects are generally formed in the two-step procedure. First, the step of implanting dopants in the silicon substrate for forming therein the source/drain diffused regions generates implantation damages in the source/drain diffused regions. Although most of the implantation damages are restored by the subsequent heat treatment, some are transformed into vacancy type defects during this heat treatment. The vacancy type defects remain in the vicinities of the metallurgical junctions formed between the source/drain diffused regions 11 and the doped channel region 6, as shown by "x" marks in FIG. 4, due to the influence by the compressive strain generated during the heat treatment. This phenomenon was assured by an experiment using an electrically detected magnetic resonance, as described in a publication "Defects related to DRAM leakage current studied by electrically detected magnetic resonance", by T. Umeda et al., vol. 308–310, pp 1169–1172 (2001).

There exist dangling bonds, or uncoupled bonds, of silicon in the vicinities of the vacancy type defects. Thus, the vacancy type defects remained in the vicinities of the metallurgical junctions 25 are raised to an energy level within the energy bandgap by the presence of the dangling bonds, thereby generating junction leakage current due to this energy level. The junction leakage current reduces the charge storage capability of the memory cell, as described above.

In the conventional fabrication process, the hydrogenating process incorporates hydrogen atoms into the silicon substrate maintained at a high temperature, to thereby terminate the dangling bonds with the hydrogen atoms and prevent the vacancy type defects from being raised to an energy level in the energy bandgap.

It is noted that, in fabrication of the memory device, a defective bit having a poor charge storage capability is generally found and rejected by an intermediate test just before the packaging process thereof, and the defective bit thus found is replaced by a redundant bit to obtain a non-defective final product. In the conventional technique using the hydrogenating process, however, although the hydrogenating process reduces the number of defective bits during the intermediate test due to an improved refreshing characteristic, there is a problem that some bits are degraded in the charge storage capability due to an increase of the junction leakage current after the packaging process performed at a temperature of about 200 degrees C. The defective bit found after the packaging process cannot be replaced any more by the redundant bit, whereby the memory device having the defective bit is abandoned.

SUMMARY OF THE INVENTION

In view of the above problem in the conventional technique, it is an object of the present invention to provide a method for forming a semiconductor device having a lower junction leakage current in a MOS transistor, and thus capable of improving a charge storage capability of a memory cell in a DRAM device if applied to fabrication of the DRAM device.

The present invention provides, in a first aspect thereof, a method for manufacturing a semiconductor device including the steps of: forming source/drain diffused regions on a surface of a semiconductor substrate; hydrogenating the surface of the semiconductor substrate including the source/drain diffused regions; and dehydrogenating the hydrogenated surface of the semiconductor substrate.

In accordance with the method of the first aspect of the present invention, the dehydrogenating step breaks the couplings between the dangling bonds and weak hydrogen atoms each having only a limited coupling energy with the dangling bond. This reduces the number of couplings having limited coupling energies before the packaging process, and thus prevents the couplings from being broken in the packaging step. Therefore, activation of the dangling bonds after the packaging step can be prevented, whereby the junction leakage current is not increased after the packaging step.

The present invention also provides, in a second aspect thereof, a method for manufacturing a semiconductor device including the steps of: forming source/drain diffused regions on a surface of a semiconductor substrate; and hydrogenating the surface of the semiconductor substrate including the source/drain diffused regions in a hydrogen ambient including deuterium at a content lower than a deuterium content of hydrogen gas existing in the natural world.

In accordance with the method of the second aspect of the present invention, the lower deuterium content in the hydrogen ambient during the hydrogenating step reduces the number of dangling bonds coupled with weak deuterium atoms in the hydrogenating step and thus separated from the weak deuterium atoms during the packaging step, thereby achieving an advantage similar to the advantage of the first aspect.

The dehydrogenating process may be preferably performed at a substrate temperature of 350 degrees C. or above in a hydrogen ambient. Using the method of the present invention in fabrication of DRAMs, the degradation of the refreshing characteristic of the memory cells can be prevented.

The above and other objects, features and advantages of the present invention will be more apparent from the following description, referring to the accompanying drawings.

PREFERRED EMBODIMENT OF THE INVENTION

Figure 1A:
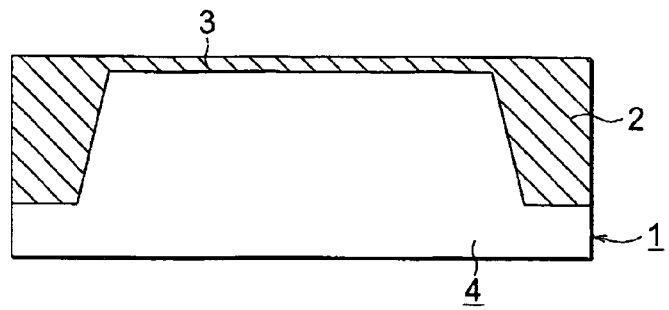
FIG. 1A to 1G are sectional views of a semiconductor device in consecutive steps of a fabrication process according to an embodiment of the present invention and of a conventional fabrication process.

Before describing preferred embodiments of the present invention, the principle of the present invention will be described for a better understanding of the present invention.

The inventors performed first and second experiments as detailed below for analyzing the behavior of the dangling bonds and hydrogen atoms. In the first experiment, a heat treatment conducted at a substrate temperature of around 300 degrees C. in a nitrogen ambient was added between the hydrogenating step and the packaging step in the conventional fabrication process. This process suppressed deterioration in the refreshing characteristic after the packaging step although the deterioration in the refreshing characteristic before the packaging step was somewhat increased. In the second experiment, the conventional fabrication process was added by a similar heat treatment, wherein the hydrogenating step was performed for a longer time and at a higher temperature than usual. This process deteriorated the refreshing characteristic before the packaging step, whereby the half-finished products were rejected in the test before the packaging step.

The hydrogen atoms terminating the dangling bonds generally have a coupling energy of about 3.5 eV in the coupling with the dangling bonds. The inventors deduced from the above results that there exist some hydrogen atoms each having a coupling energy less than about 3.5 eV, which are hereinafter referred to as weak hydrogen atoms. The weak hydrogen atoms are thermally unstable, and thus affected by the heat even at a substrate temperature of 200 degrees C. during the packaging step to be separated from the dangling bonds. This activates the separated dangling bonds, resulting in an increase of the junction leakage current and thus deterioration in the refreshing characteristic.

The reason of suppression in the refreshing characteristic after the packaging step in the first experiment was considered due to the fact that the weak hydrogen atoms, which are possibly separated from the dangling bonds during the packaging step, were separated from the dangling bonds during the added heat treatment in the nitrogen ambient before the packaging step. On the other hand, it was considered that the longer-time and higher-temperature hydrogenating step in the second experiment separated the hydrogen atoms having a higher coupling energy from the dangling bonds during the hydrogenating step, and that the increased number of separated dangling bonds deteriorated the refreshing characteristic during the intermediate test before the packaging step. These hydrogen atoms each having a higher coupling energy and thus capable of forming a thermally stable coupling with the dangling bonds are hereinafter referred to as strong hydrogen atoms.

In view of the above results, the process according to the present invention includes a dehydrogenating step between the hydrogenating step and the packaging step. The dehydrogenating step is performed in an inactive gas ambient at a substrate temperature of, for example, 300 degrees C., which is lower than the substrate temperature during the hydrogenating step. This dehydrogenating step separates the weak hydrogen atoms from the dangling bonds while leaving the strong hydrogen atoms to terminate the dangling bonds, whereby the number of dangling bonds separated by the heat during the packaging step is reduced. Although the dehydrogenating step increases the number of dangling bonds separated from the weak hydrogen atoms before the packaging step, the defective bits caused by separation of the dangling bonds during the dehydrogenating step can be replaced by the redundant bits, whereby the final product is free from the defective bits generated by the increased number of the separated dangling bonds.

It should be noted here that deuterium atoms, which are contained in the hydrogen gas existing in the natural world at a content of about 150 ppm, have a lower coupling energy and thus are categorized here as the weak hydrogen atoms. A third experiment was performed for a fabrication process of DRAMs including a specific hydrogenating step, in consideration of the case wherein these deuterium atoms may terminate the dangling bonds with a weak coupling energy in the hydrogenating step.

Figure 2:
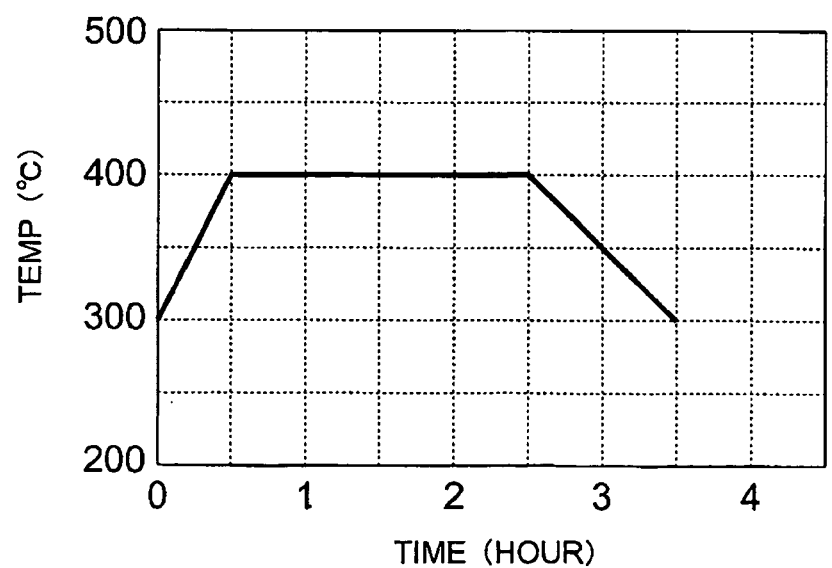
FIG. 2 is a graph showing a time table of the substrate temperature used in the fabrication process of an embodiment of the present invention.

In the third experiment, the substrate temperature during the hydrogenating step was changed with time along the temperature profile shown in FIG. 2. In this temperature profile, the substrate temperature was raised from 300 degrees C. toward 400 degrees C. at a constant rate in first 30 minutes, held at the 400 degrees C. for next two hours, and lowered from the 400 degrees C. down to 300 degrees C. at another constant rate in the next one hour. In this experiment, the hydrogen ambient in the hydrogenating step had a variety of deuterium contents between 15 ppm and 150 ppm.

The DRAMs obtained in the third experiment was tested for the deterioration in the refreshing characteristic thereof before and after the packaging step. The defective percent for the deterioration was calculated as the percent ratio of the number of bits each having a deteriorated refreshing characteristic, i.e., a refreshing time of 200 seconds or below after the packaging step, to the total number of bits each having a normal refreshing characteristic, i.e., a refreshing time of 300 seconds or above before the packaging step.

Figure 3:
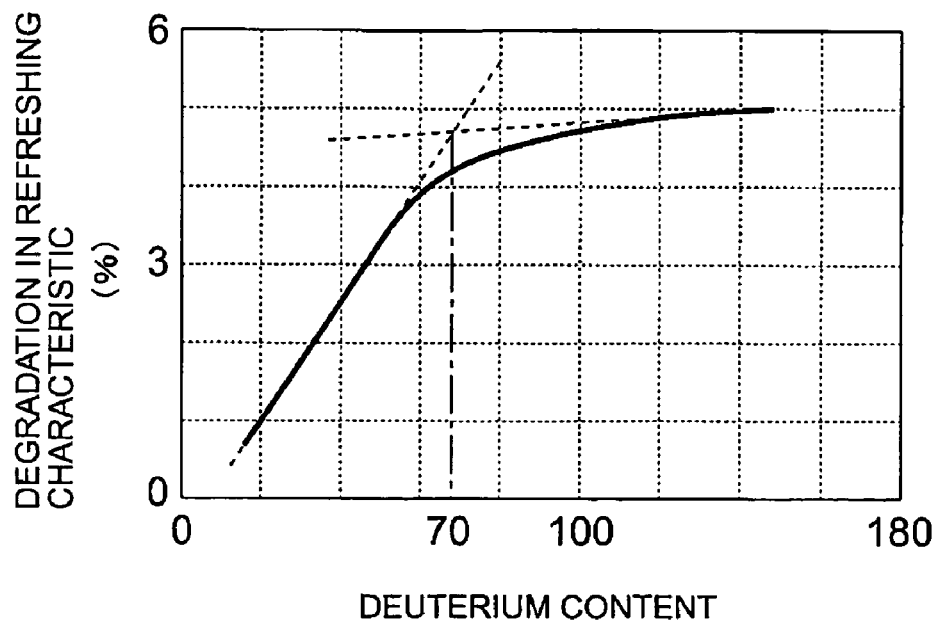
FIG. 3 is a graph showing the relationship between the deuterium content and deterioration in the refreshing characteristic of DRAM cells.
Figure 4:
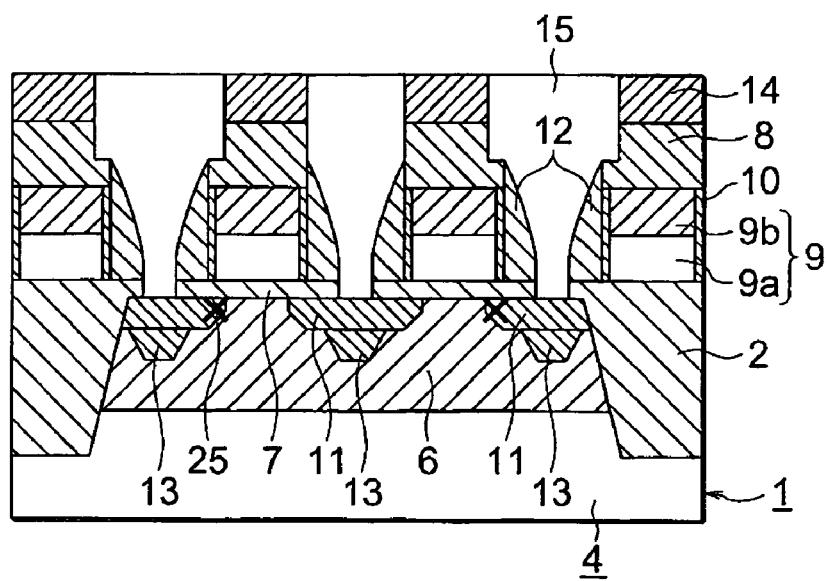
FIG. 4 is a sectional view showing the presence of vacancy type defects in MOSFETs in a DRAM device.

The results of degradation in the refreshing characteristic by the packaging step is shown in FIG. 3 as the relationship between the deuterium content (abscissa) and the defective percent of the bits (ordinate). As understood from FIG. 3, in the hydrogen ambient during the hydrogenating step, a lower deuterium content below 150 ppm provides a lower defective percent, and especially the slope of the defective percent is markedly lowered below a deuterium content of about 70 ppm. This means an effective suppression of the deterioration in the refreshing characteristic is achieved by employing a deuterium content of about 70 ppm or below.

Now, the present invention is more specifically described with reference to accompanying drawings, wherein similar constituent elements are designated by similar reference numerals throughout the drawings. A method for manufacturing a semiconductor device according to an embodiment of the present invention includes a dehydrogenating step in addition to the conventional fabrication process as described before. The detail of the process according to the present embodiment will be described with reference to FIGS. 1A to 1G which are also referenced during the description of the conventional process.

A 250-nm-deep trench is formed on a surface region of a silicon substrate 1, followed by depositing a silicon oxide film 2 within the trench to form a shallow trench isolation (STI) structure. Subsequently, a 10-nm-thick silicon oxide film 3 is formed on the silicon substrate 1, as shown in FIG. 1A, followed by implantation of boron ions through the silicon oxide film 3 for three times. The three-time implantation of boron ions is conducted at an acceleration energy of 250 keV and a dosage of $1 \times 10^{13}/cm^2$, at an acceleration energy of 150 keV and a dosage of $5\times10^{12}$ cm/$^2$, and at an acceleration energy of 80 keV and a dosage of $3\times10^{12}$/cm$^2$. Thereafter, a heat treatment is performed at a substrate temperature of 1000 degrees C. for 30 minutes to restore the silicon substrate from the damages caused by boron implantation, thereby forming p-wells 4 on the silicon substrate 1.

Figure 1B:
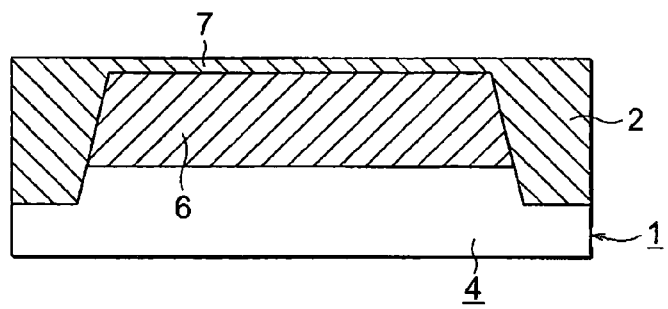
Figure 1C:
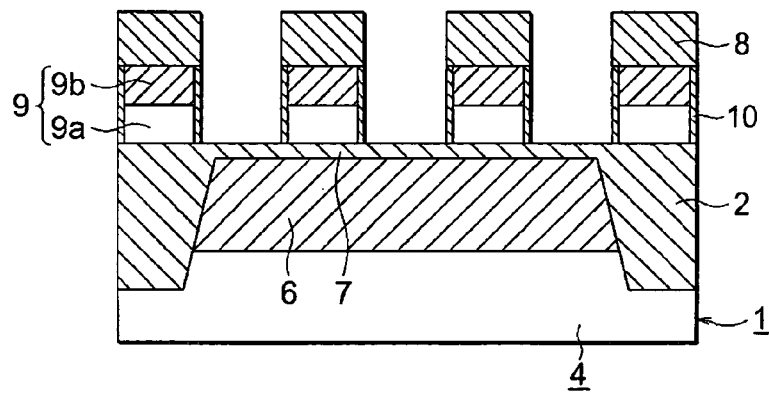
Figure 1D:
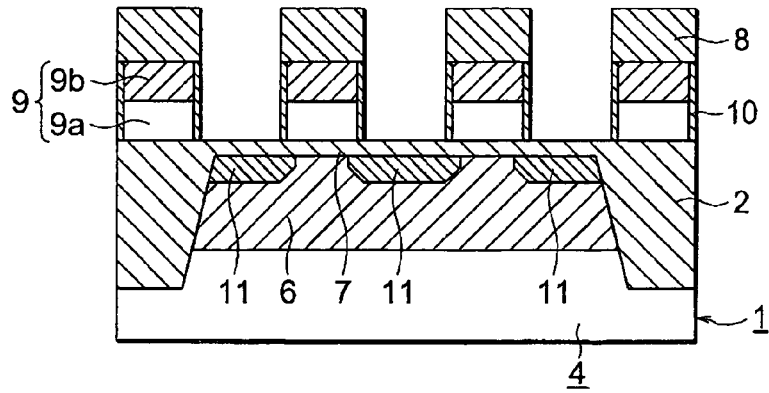

Subsequently, further implantation of boron ions through the thin silicon oxide film 3 is performed at an acceleration energy of 15 keV and a dosage of $1\times10^{13}$/cm$^2$, thereby forming p-type channel regions 6, as shown in FIG. 1B. After removing the thin silicon oxide film 3, a 6-nm-thick gate insulation film 7 made of silicon oxide is formed using a thermal oxidation technique. The threshold voltage of a cell transistor is generally designed by determining the impurity concentration profile of the p-type channel region 6 and the thickness of the gate insulation film 7.

Thereafter, on the gate insulation film 7 are consecutively formed a 100-nm-thick polysilicon film 9a doped with phosphorous at a concentration of $4\times10^{20}$/cm$^3$, a 70-nm-thick tungsten silicide film 9b, and a 130-nm-thick insulation film 8 including a silicon nitride layer and a silicon oxide layer. Subsequently, the insulation film 8, tungsten silicide film 9b and polysilicon film 9a are patterned to configure 2-layer gate electrodes 9 and overlying insulation films 8. Side-wall oxide films 10 are then formed on the side walls of the gate electrodes 9 by using a thermal oxidation technique. This thermal oxidation also oxidizes surface portions of the silicon substrate 1 exposed by the patterning process.

Thereafter, implantation of phosphorous ions is performed twice through the gate insulation film 7 by a self-aligned process using the gate electrodes 9 as a mask at an acceleration energy of 20 keV and a dosage of $7\times10^{12}$/cm$^2$, and at an acceleration energy of 15 keV and a dosage of $7\times10^{12}$/cm$^2$. Another heat treatment is then performed at a substrate temperature of 1000 degrees C. for 10 seconds to activate the implanted phosphorous ions for obtaining source/drain diffused regions 11 as well as to activate dopants in the diffused regions in the peripheral area of the memory device.

Figure 1E:
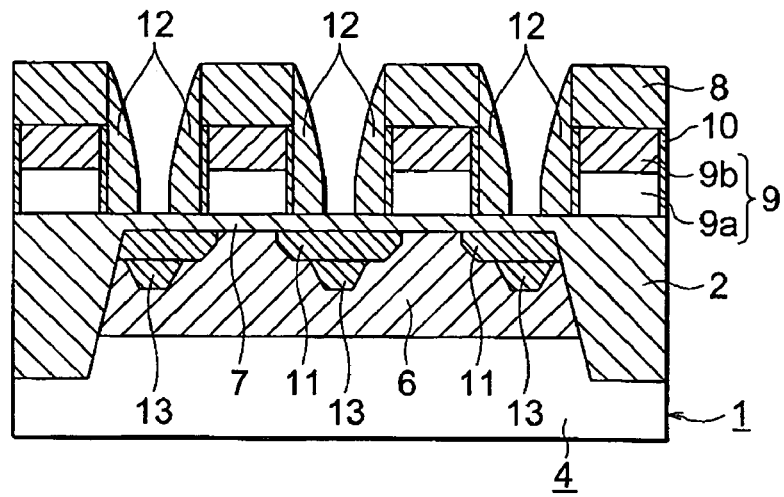

A silicon nitride film is then deposited and subjected to an etch-back process, thereby forming a 40-nm-thick silicon-nitride side spacers 12, as shown in FIG. 1E. Implantation of phosphorous ions through the gate insulation film 7 and the source/drain diffused regions 11 is then performed by a self-aligned technique using the insulation film 8 and the side spacers 12 on the gate electrodes 9, thereby forming electric-field alleviating regions 13 on the bottoms of the source/drain diffused regions 11.

Figure 1F:
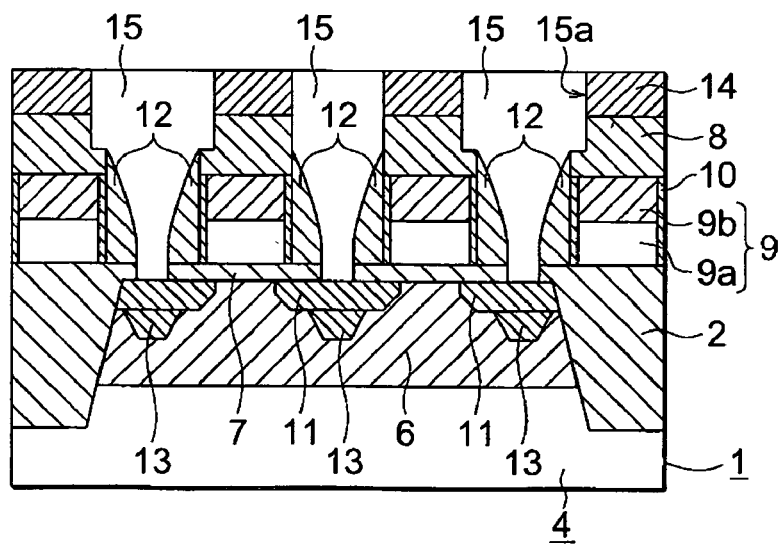

Subsequently, as shown in FIG. 1F, a silicon oxide film and a silicon nitride film are consecutively deposited on the entire surface, thereby forming a 350-nm-thick interlayer dielectric film 14. The interlayer dielectric film 14 is then etched-back using an anisotropic etching technique for planarization thereof. A patterning process is then performed to the interlayer dielectric film 14, insulation films 8, side spacers 12 and gate insulation film 7 to form through-holes 15a for exposing therethrough surface portions of the source/drain diffused regions 11. Implantation of phosphorous ions is again performed by a self-aligned technique using the interlayer dielectric film 14, insulation films 8 and side spacers 12 as a mask, toward the bottom of the electric-field alleviating regions 13 through the source/drain diffused regions 11. A polysilicon film doped with phosphorous ions at a concentration of $2\times10^{20}$/cm$^3$ is then deposited on the interlayer dielectric film 14 and in the through-holes 15a, and etched-back to configure 350-nm-long contact plugs 15.

Figure 1G:
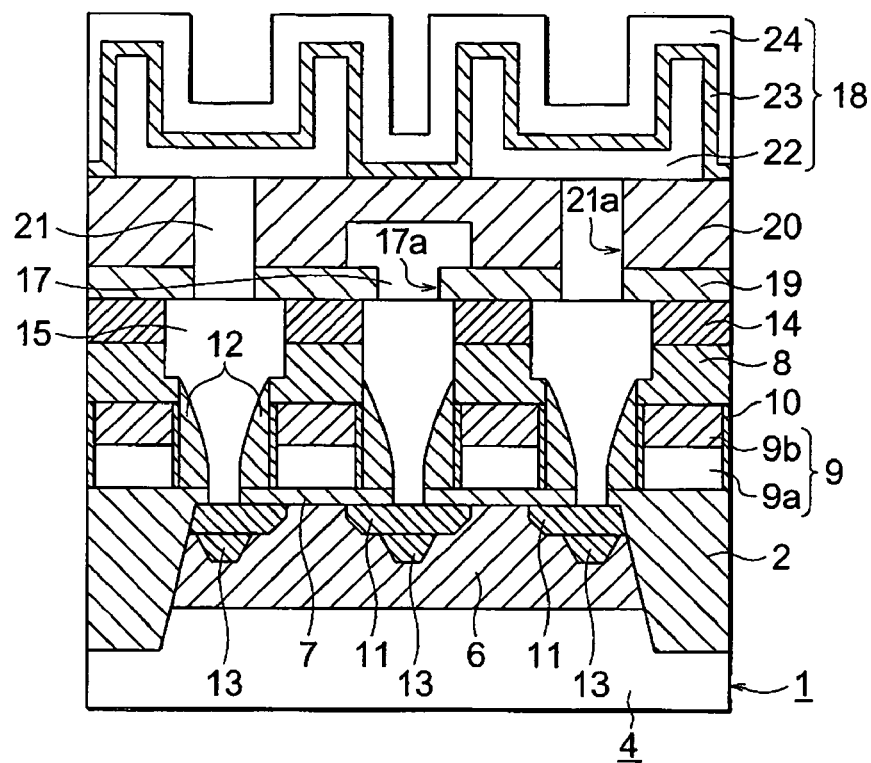

Subsequently, a 50-nm-thick interlayer dielectric film 19 made of silicon oxide is deposited and patterned to form through-holes 17a therein. A 100-nm-thick tungsten film is then deposited on the interlayer dielectric film 19 and in the through-holes 17a, and patterned to configure bit lines 17. Thereafter, an interlayer dielectric film 20 is deposited, followed by patterning the interlayer dielectric films 19 and 20 to form through-holes 21a therein and filling the through-holes 21a with contact plugs 21. Cell capacitors 18 each having a cylindrical structure and including a bottom electrode 22, an insulation film 23 and a top electrode 24 are then formed, the bottom electrode 22 being in contact with the underlying contact plug 21, as shown in FIG. 1G.

A hydrogenating step is then performed based on the time table shown in FIG. 2, wherein the substrate temperature is raised from 300 degrees C. toward 400 degrees C. in the first 30 minutes at a constant rate, maintained at the 400 degrees C. for the next two hours, and lowered from the 400 degrees C. to 300 degrees C. at another constant rate in the next one hour. During the substrate-temperature lowering step, the hydrogen ambient is replaced by a nitrogen ambient after the substrate temperature reached 350 degrees C., whereby the process shifts from the hydrogenating step to a dehydrogenating step in the further temperature-lowering step. This dehydrogenating step is equivalent to a heat treatment at a constant substrate temperature of 325 degrees C. in a nitrogen ambient for 30 minutes. The dehydrogenating step substantially separates only the weak hydrogen atoms among the hydrogen atoms coupled to the dangling bonds in the previous hydrogenating step.

In accordance with the process of the present embodiment, the separation of the weak hydrogen atoms from the corresponding dangling bonds in the dehydrogenating step prevents the weak hydrogen atoms from being separated to generate activated dangling bonds during the subsequent packaging step. This suppresses degradation in the refreshing characteristic of a DRAM after the packaging step. It is to be noted that the dehydrogenating step may be performed at any stage so long as the dehydrogenating step is performed between the hydrogenating step and the packaging step.

Modifications from the above embodiment will be described hereinafter. A first modification is such that the dehydrogenating step is performed at a substrate temperature of 340 degrees C. in a nitrogen ambient, after the hydrogenating step is finished in the hydrogen ambient while controlling the substrate temperature based on the time table shown in FIG. 2. A second modification is such that the dehydrogenating step is performed in a nitrogen ambient at a substrate temperature of 300 degrees C. for 60 minutes, after the hydrogenating step is finished in the hydrogen ambient while controlling the substrate temperature based on the time table of FIG. 2.

DRAM devices were manufactured by the processes according to the first embodiment and the first and second modifications as described above, and herein referred to as first through third samples, respectively. Another DRAM was also manufactured by a conventional process including a hydrogenating step wherein the substrate temperature was controlled based on the time table of FIG. 2, and herein referred to as a fourth sample. The first through fourth samples were subjected to measurement of refreshing characteristic to exhibit degradations of about 3%, about 1%, about 2% and about 5%, respectively, in the refreshing characteristic. Comparison of the first through third samples against the fourth sample revealed the advantage of the present embodiment as to the suppression of the degradation in the refreshing characteristic over the conventional process.

A process according to a second embodiment of the present invention is such that a hydrogenating step is conducted in a hydrogen ambient having a deuterium content of 20 ppm, without using a subsequent dehydrogenating step. In the present embodiment, the reduced content of deuterium atoms reduces the possibility of the weak hydrogen atoms terminating the dangling bonds during the hydrogenating step. This achieves an advantage similar to the advantage of the first embodiment, wherein the number of hydrogen atoms separated from the dangling bonds during the packaging step is reduced.

The degradation in the refreshing characteristic in the DRAM manufactured by the method of the present embodiment was about 1% as shown in FIG. 3. This revealed the advantage of the present embodiment over the conventional technique. The method of the second embodiment may include an additional dehydrogenating step as conducted in the first embodiment, thereby achieving a further improvement of the refreshing characteristic.

Since the above embodiments are described only for examples, the present invention is not limited to the above embodiments and various modifications or alterations can be easily made therefrom by those skilled in the art without departing from the scope of the present invention. For example, the present invention is not limited to a method for manufacturing a DRAM device and may be applied to a method for forming other semiconductor devices such as including MOS FETs. The substrate may be other than a silicon substrate and the dopants may be selected as desired.

What is claimed is:

1. A method for manufacturing a semiconductor device comprising:
    forming source/drain diffused regions on a surface of a semiconductor substrate;
    hydrogenating the surface of said semiconductor substrate including said source/drain diffused regions; and
    dehydrogenating said hydrogenated surface of said semiconductor substrate;
    wherein said hydrogenating is conducted in a hydrogen ambient at a substrate temperature of at least 350 degrees C.; and
    wherein said hydrogen ambient has a deuterium content lower than a deuterium content in hydrogen gas existing in the natural world.

2. The method according to claim 1, wherein said deuterium content of said hydrogen ambient is not higher than 70 ppm.

3. The method according to claim 1, wherein said dehydrogenating is conducted in an inactive gas ambient at a substrate temperature of lower than 350 degrees C.

4. The method according to claim 3, wherein said dehydrogenating is conducted at a substrate temperature of least 250 degrees C.

5. The method according to claim 4, wherein said inactive gas ambient includes nitrogen or argon.

6. The method according to claim 1, wherein said semiconductor device is a DRAM device.

7. A method for manufacturing a semiconductor device comprising:
    forming source/drain diffused regions on a surface of a semiconductor substrate; and
    hydrogenating the surface of said semiconductor substrate including said source/drain diffused regions in a hydrogen ambient including deuterium at a content lower than a deuterium content of hydrogen gas existing in the natural world.

8. The method according to claim 7, wherein said hydrogenating is conducted at a substrate temperature of least 350 degrees C.

9. The method according to claim 7, wherein the deuterium content of said hydrogen ambient is not higher than 70 ppm.

* * * * *